US009281274B1

(12) United States Patent
Zhao et al.

(10) Patent No.: US 9,281,274 B1
(45) Date of Patent: Mar. 8, 2016

(54) INTEGRATED CIRCUIT THROUGH-SUBSTRATE VIA SYSTEM WITH A BUFFER LAYER AND METHOD OF MANUFACTURE THEREOF

(71) Applicants: Xing Zhao, Singapore (SG); Chang Bum Yong, Singapore (SG); Duk Ju Na, Singapore (SG); Kyaw Oo Aung, Singapore (SG); Ling Ji, Singapore (SG)

(72) Inventors: Xing Zhao, Singapore (SG); Chang Bum Yong, Singapore (SG); Duk Ju Na, Singapore (SG); Kyaw Oo Aung, Singapore (SG); Ling Ji, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 165 days.

(21) Appl. No.: 14/040,413

(22) Filed: Sep. 27, 2013

(51) Int. Cl.
*H01L 23/48* (2006.01)
*H01L 23/52* (2006.01)
*H01L 29/40* (2006.01)
*H01L 23/532* (2006.01)
*H01L 21/768* (2006.01)

(52) U.S. Cl.
CPC ...... *H01L 23/53238* (2013.01); *H01L 21/7685* (2013.01)

(58) Field of Classification Search
USPC ............ 257/774, 737, 761, 762, 784, 94; 438/26, 51
See application file for complete search history.

(56) References Cited

U.S. PATENT DOCUMENTS

| | | | |
|---|---|---|---|
| 7,884,016 B2 | 2/2011 | Sprey et al. | |
| 8,299,612 B2 | 10/2012 | West et al. | |
| 2008/0099913 A1* | 5/2008 | Lehr | H01L 24/03 257/737 |
| 2008/0303154 A1 | 12/2008 | Huang et al. | |
| 2010/0200898 A1* | 8/2010 | Lin | H01L 27/14618 257/294 |
| 2011/0291267 A1 | 12/2011 | Wang et al. | |
| 2013/0009286 A1* | 1/2013 | Kim | H01L 24/11 257/632 |

OTHER PUBLICATIONS

Yoon et al., "TSV MEOL (Mid-End-Of-Line) and its Assembly/Packaging Technology for 3D/2.5D Solutions", ICEP-IAAC 2012 Proceedings, 2012, p. 5 pgs.

* cited by examiner

*Primary Examiner* — Dao H Nguyen
*Assistant Examiner* — Tram H Nguyen
(74) *Attorney, Agent, or Firm* — Ishimaru & Associates LLP

(57) ABSTRACT

An integrated circuit substrate via system, and method of manufacture therefor, includes: a substrate having a substrate via in the substrate; a buffer layer patterned over the substrate via, the buffer layer having a planar surface; and a substrate via cap patterned over the buffer layer, the substrate via cap having a planar surface based on the planar surface of the buffer layer.

17 Claims, 7 Drawing Sheets

1500

PROVIDING A SUBSTRATE   1502

PATTERNING A PHOTORESIST LAYER   1504

PATTERNING A BUFFER LAYER   1506

PATTERNING A SUBSTRATE VIA CAP   1508

REMOVING THE PHOTORESIST LAYER   1510

FIG. 15

INTEGRATED CIRCUIT THROUGH-SUBSTRATE VIA SYSTEM WITH A BUFFER LAYER AND METHOD OF MANUFACTURE THEREOF

TECHNICAL FIELD

The present invention relates generally to an integrated circuit technology and more particularly to through silicon vias (TSVs) in silicon substrates.

BACKGROUND ART

As the trend of consumer electronic products leans to light weight, thinness, and slightness, integrated circuit manufacturing technologies are developed to improve integration density as the geometry of integrated circuits is minimized, to allow more components to be integrated into a single chip.

Although dramatic technology developments have resulted in considerable improvements in two-dimensional integrated circuit manufactory, there are physical limitations to the density that can be achieved. One of the limitations is the minimum size needed for components. Others may include the design complexity when more devices are integrated into one chip. Additional limitation comes from the significant increase in the number and length of interconnections between devices as the number of devices increases. The increased complexity of interconnection routing causes increased RC delay and power consumption.

To overcome the two-dimensional integrated circuit limitations, advanced three-dimensional integrated circuit and multi-chip stacking technology are developed. The three-dimensional multi-chip stacking technology employs wafer-level package technology, in which through silicon-vias (TSVs) in silicon dies are introduced for connecting dies vertically in three-dimensional integration Conventional TSVs in silicon dies are developed by opening vertical through wells in a silicon wafer, insulating the through wells, filling the through wells with metallic materials, depositing a multi-layer TSV cap, and singulating the silicon wafer into individual silicon die. An integrated circuit chip is then electrically bonded to the individual silicon die to achieve three-dimensional integration.

However, there have been many problems in using these TSV dies because of electrical connection problems between the individual die and the integrated circuit chip.

Thus, a need remains for improving the TSV technology. In view of the ever-increasing commercial competitive pressures, along with growing consumer expectations, it is critical that answers be found for the electrical connection problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacturing an integrated circuit substrate via system including: providing a substrate having a substrate via in the substrate; patterning a photoresist layer over the substrate; patterning a buffer layer over the substrate via in the photoresist layer, the buffer layer having a planar surface; patterning a substrate via cap over the buffer layer in the photoresist layer, the substrate via cap having a planar surface based on the planar surface of the buffer layer; and removing the photoresist layer.

The present invention provides an integrated circuit substrate via system including: a substrate having a substrate via in the substrate; a buffer layer patterned over the substrate via, the buffer layer having a planar surface; and a substrate via cap patterned over the buffer layer, the substrate via cap having a planar surface based on the planar surface of the buffer layer.

Certain embodiments of the invention have other steps or elements in addition to or in place of those mentioned above. The steps or element will become apparent to those skilled in the art from a reading of the following detailed description when taken with reference to the accompanying drawings.

BRIEF DESCRIPTION OF THE DRAWINGS

FIG. 15 is a flow chart of a method for manufacturing an integrated circuit TSV system in an embodiment of the present invention.

BEST MODE FOR CARRYING OUT THE INVENTION

Figure 1:
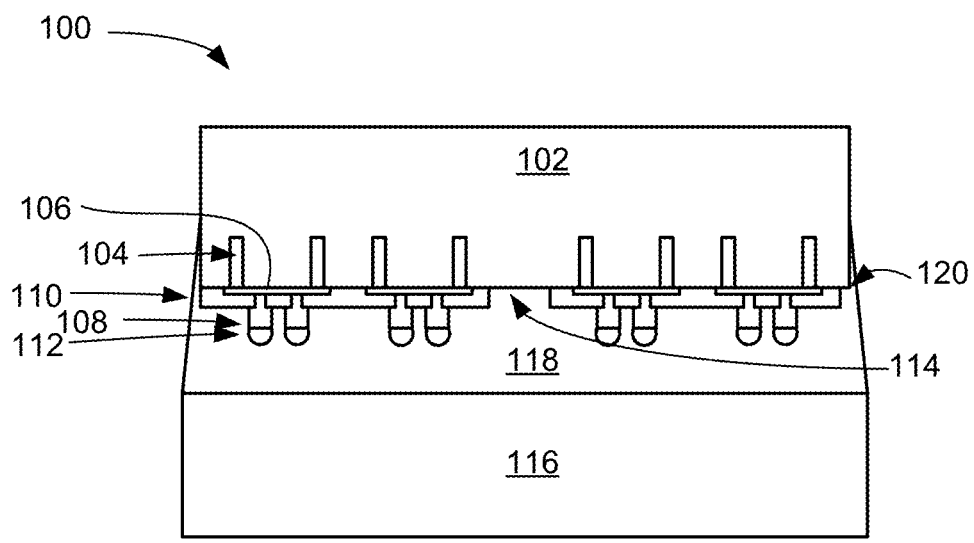
FIG. 1 is a cross-sectional view of a substrate via system in an intermediate stage of manufacture.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

The same numbers are used in all the drawing FIGs. to relate to the same elements. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of a substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements.

The term "processing" as used herein includes deposition of material or photoresist, patterning, exposure, development, etching, cleaning, and/or removal of the material or photoresist as required in forming a described structure.

Conventional TSVs in silicon dies are developed by opening vertical through wells in a silicon wafer, insulating the through wells, filling the through wells with metallic materials, depositing a multi-layer TSV cap, and singulating the silicon wafer into individual silicon die. An integrated circuit chip is then electrically bonded to the individual silicon die.

Poor bonding and poor electrical connections between the integrated circuit chip and the individual silicon TSV die has been traced to the conductive caps on top of the TSVs. The conductive caps are required for bonding to the integrated circuit chip connectors.

It has been unexpectedly discovered that the problems are caused by the formation of concave surfaces, or dishing, at the top of the TSV caps. The dishing prevents good contact with the mating surfaces of the integrated circuit chip. With a TSV cap of around 6.0 µm in height, the dishing may be as much as 1.0 µm in depth.

For copper filled TSVs, the TSV cap is often a multi-layer of a copper seed layer on the copper filled via, a copper plated layer, a nickel adhesive layer, and a top gold contact layer.

It was discovered that the crystalline structure of the TSV is continued into seed layer. This results in the plating rate on the seed layer above the center of the TSV to be slower than above the periphery of the TSV. As the plated layer is plated on the seed layer, the differential plating causes the center of the plated layer to be concave and to be dished. This dishing is continued through the other layers deposited above the plating layer.

It was further discovered that, by providing a different material above the seed layer, the transfer of the crystal structure of the copper seed layer to the copper plated area would be stopped by a layer of conductor having a different crystal structure. This layer is called a "buffer" layer and helps minimize dishing.

However, this created the concern that the buffer layer would cause a degradation in the conductivity of the TSVs due to the additional resistance of the buffer layer.

Through experimentation, it was found that the resistance of a TSV with caps at both ends is about 0.42 ohms. By addition of a 0.5 µm nickel buffer layer, the resistance would only be increased by 0.00011 ohms. Thus, the resistance concerns could be minimized by reducing the thickness of the buffer layer. A thin buffer layer can increase conductivity of a substrate via cap, such as a TSV cap, to compensate for increased resistivity of the buffer layer.

Further, it was found that, by reducing the thickness of the adhesive layer, the conductivity of the TSV cap would be unchanged due to the addition of the buffer layer while minimizing the dishing problem. This is effectively increasing the conductivity of the TSV cap to compensate for increases in the resistivity of the buffer layer.

Referring now to FIG. 1, therein is shown a cross-sectional view of a substrate via system in an intermediate stage of manufacture. The substrate via system can be a through silicon via (TSV) system 100. The TSV system includes a substrate, such as a silicon substrate 102, having insulated pillars, such as silicon vias 104, embedded in the silicon substrate 102.

The silicon vias 104 may be interconnected to one or more redistribution layers 106. The redistribution layer 106 can be connected to other silicon via 104 and under bump metallurgies 108 embedded in insulating layers 110. The under bump metallurgies are bumped with solder bumps 112.

The silicon substrate 102 has a front surface 114 to which a temporary carrier 116 is bonded by an adhesive 118. The silicon substrate 102 has side edges 120 that are sunk into the adhesive 118. The temporary carrier 116 provides support for the silicon substrate during thinning operations.

Thickness reduction is performed by so-called backside grinding of a semiconductor wafer on the surface opposite that containing pattern-formed circuitry.

Figure 2:
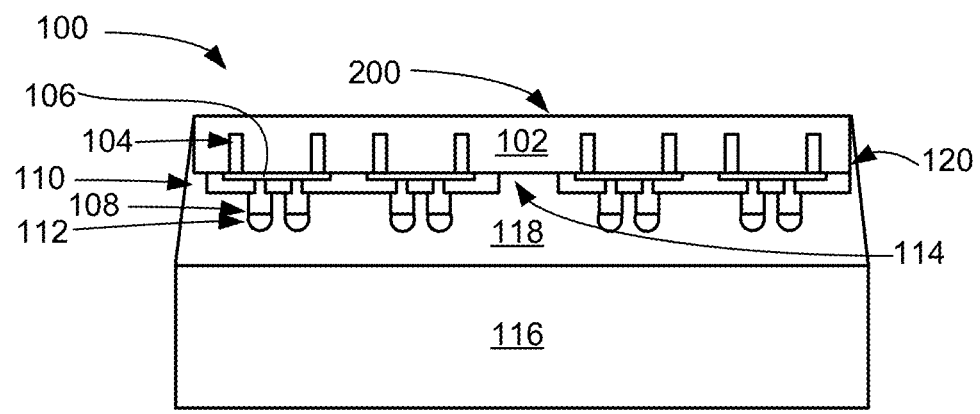
FIG. 2 is a cross-sectional view of FIG. 1 after backside grinding.

Referring now to FIG. 2, therein is shown a cross-sectional view of FIG. 1 after backside grinding. A ground surface 200 is exposed on the silicon substrate 102.

Figure 3:
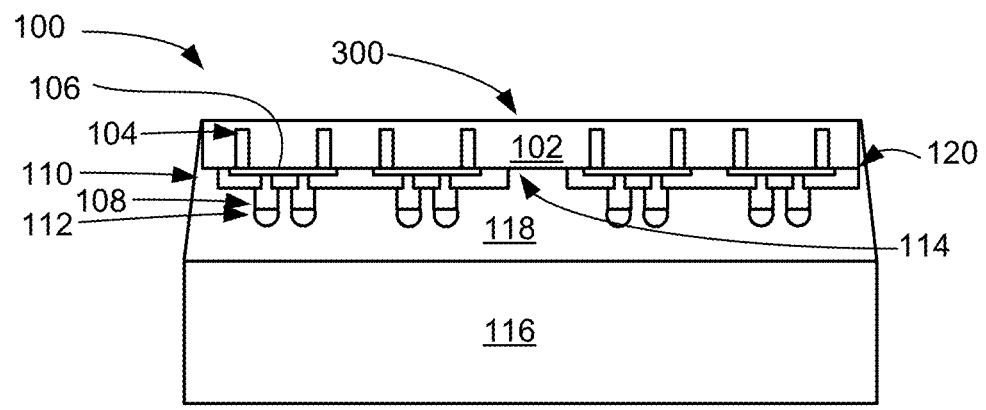
FIG. 3 is a cross-sectional view of FIG. 2 after first chemical-mechanical planarization (CMP).

Referring now to FIG. 3, therein is shown a cross-sectional view of FIG. 2 after first chemical-mechanical planarization (CMP). A polished surface 300 is exposed on the silicon substrate 102.

Figure 4:
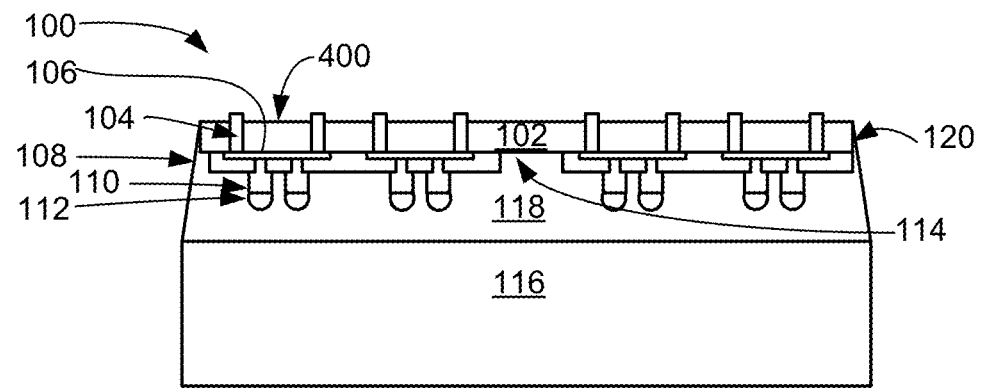
FIG. 4 is a cross-sectional view of FIG. 3 after silicon recessing.

Referring now to FIG. 4, therein is shown a cross-sectional view of FIG. 3 after silicon recessing. A recessed surface 400 is exposed along with the tips of the silicon vias 104.

Figure 5:
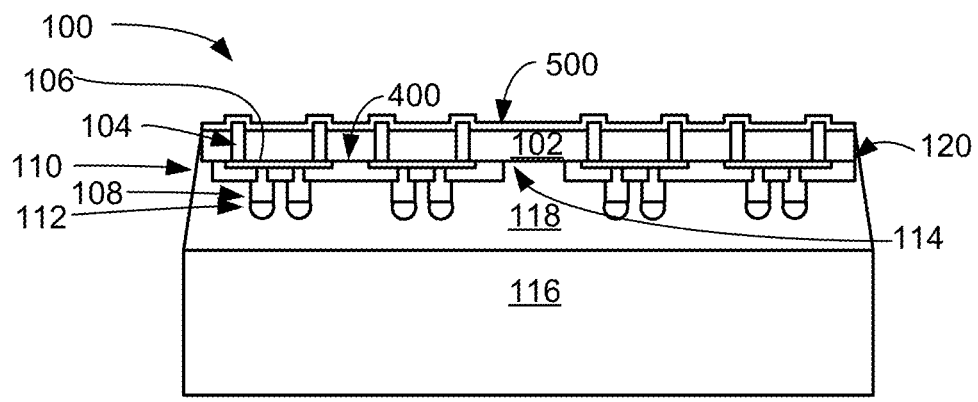
FIG. 5 is a cross-sectional view of FIG. 4 after a deposition process.

Referring now to FIG. 5, therein is shown a cross-sectional view of FIG. 4 after a deposition process. A passivation layer 500 is uniformly deposited over the recessed surface 400 and the tips of the silicon vias 104.

Figure 6:
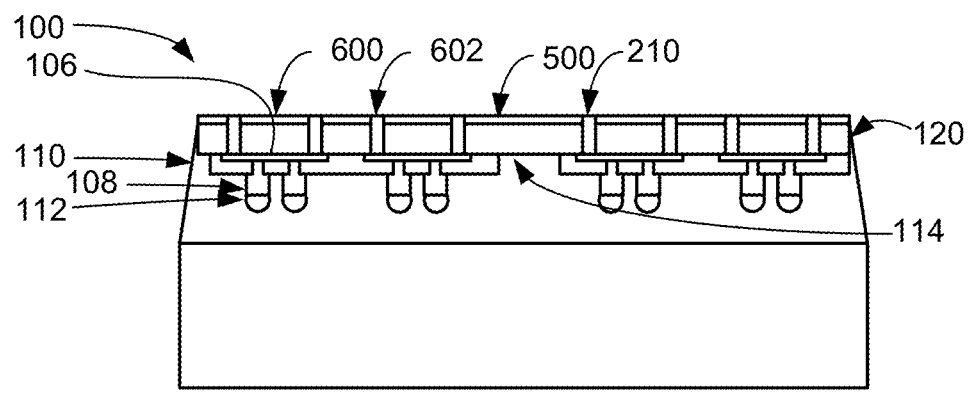
FIG. 6 is a cross-sectional view of FIG. 5 after second chemical-mechanical planarization (CMP).

Referring now to FIG. 6, therein is shown a cross-sectional view of FIG. 5 after second chemical-mechanical planarization (CMP). A top surface 600 of the passivation layer 500 is exposed and through substrate vias, such as through silicon vias (TSVs) 602, are formed from the silicon vias 104 of FIG. 5.

Figure 7:
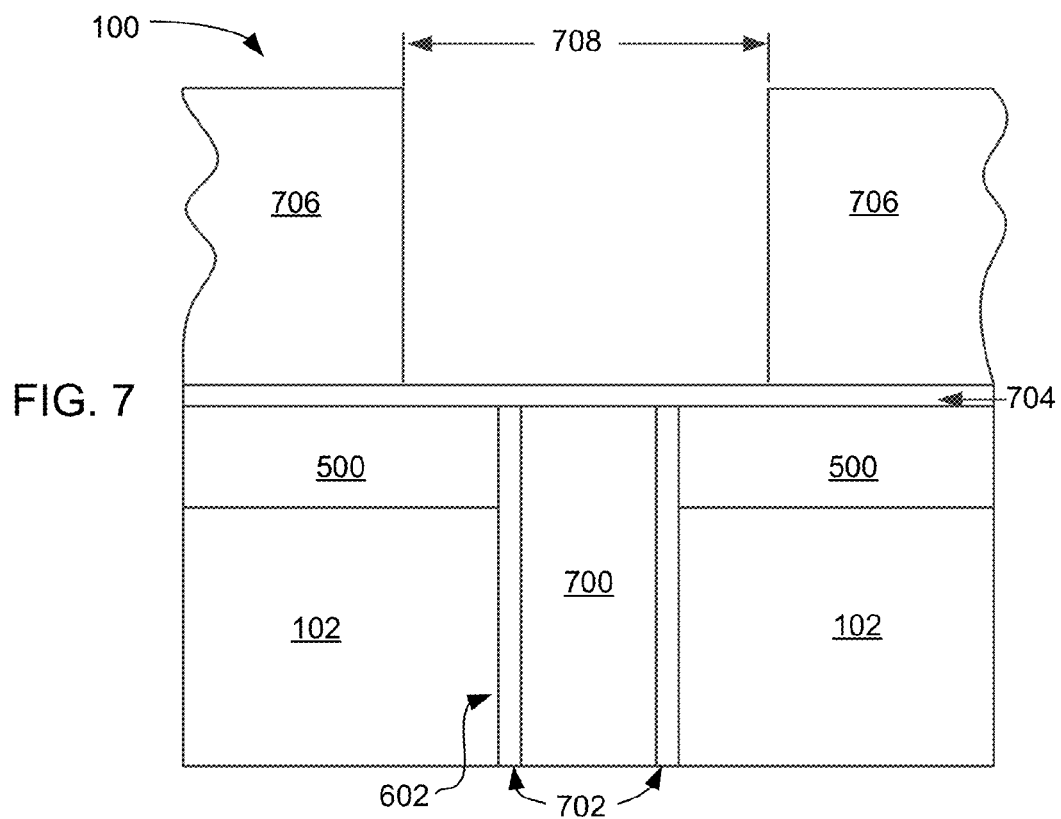
FIG. 7 is cross-sectional view of FIG. 6 after further processing.

Referring now to FIG. 7, therein is shown a cross-sectional view of FIG. 6 after further processing. The TSV 602 is formed of a conductive core, such as a copper core 700, surrounded by an insulator, such as a liner oxide 702. A seed layer 704 of a chemically deposited conductor, such as copper, has been deposited on the passivation layer 500. A photoresist layer 706 has been deposited on the seed layer 704 and patterned to have an opening 708.

The opening 708 extends beyond the perimeter of the TSV 602 and is centered with the TSV 602. Typically, the opening 708 is round as being consistent with the TSV 602.

Figure 8:
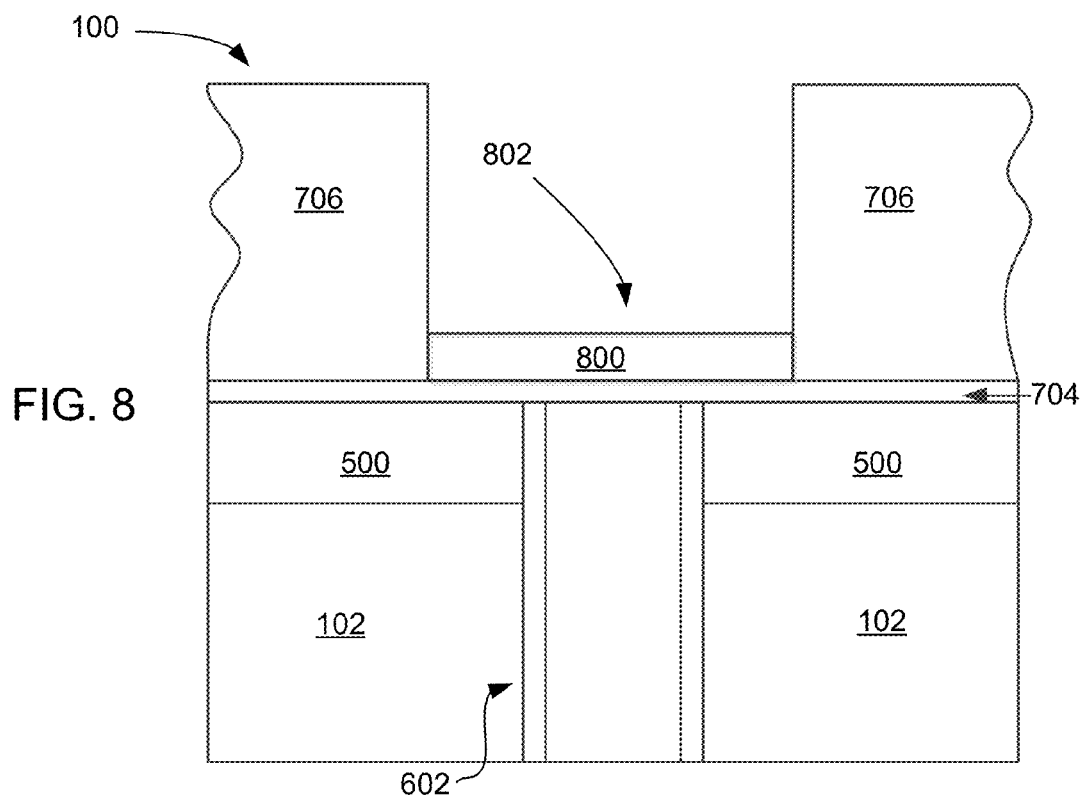
FIG. 8 is a cross-sectional view of FIG. 7 after a buffer layer is deposited.

Referring now to FIG. 8, therein is shown a cross-sectional view of FIG. 7 after a buffer layer 800 is deposited. In one embodiment, there is a single buffer layer formed on the top of the seed layer 704 and patterned in the photoresist layer 706. Typically, the buffer layer 800 is formed of a conductive material, such as nickel, which is different material from the seed layer 704, which is generally of copper.

It has been discovered that the buffer layer 800 can be deposited by a process, such as plating, to have a top planar surface 802 without dishing or a center depression under 1.0 µm in depth.

Figure 9:
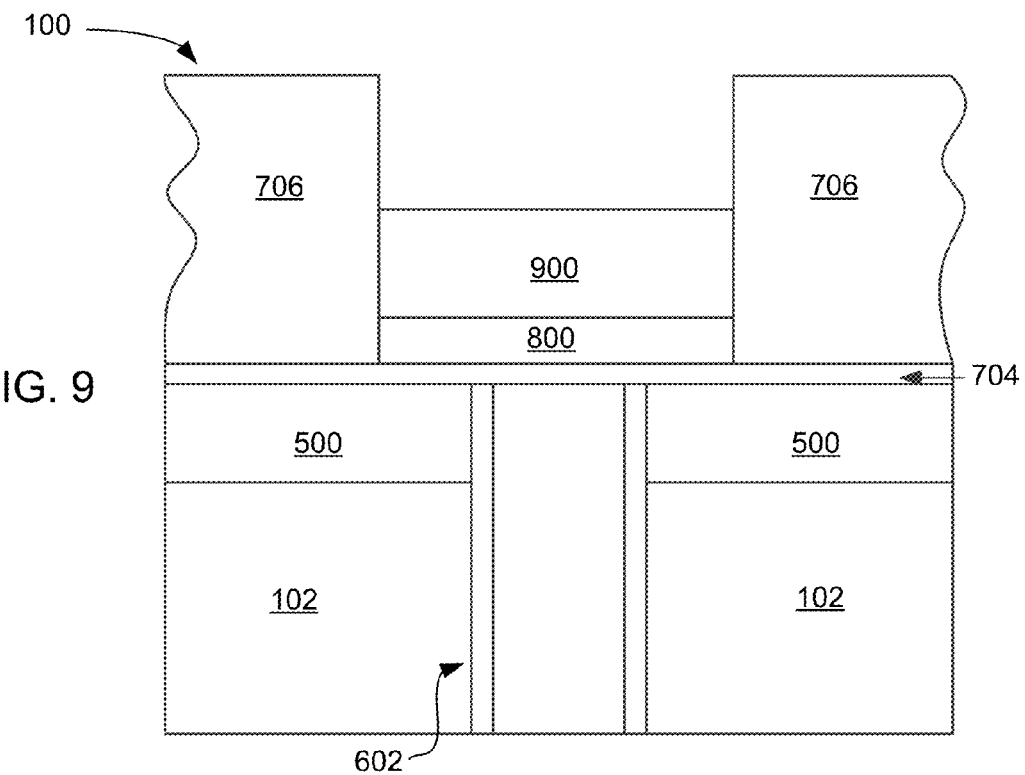
FIG. 9 is a cross-sectional view of FIG. 8 after deposition of a support layer.

Referring now to FIG. 9, therein is shown a cross-sectional view of FIG. 8 after deposition of a support layer 900. The support layer 900 is deposited on and over the top of the buffer layer 800 and patterned in the patterned photoresist layer 706.

Figure 10:
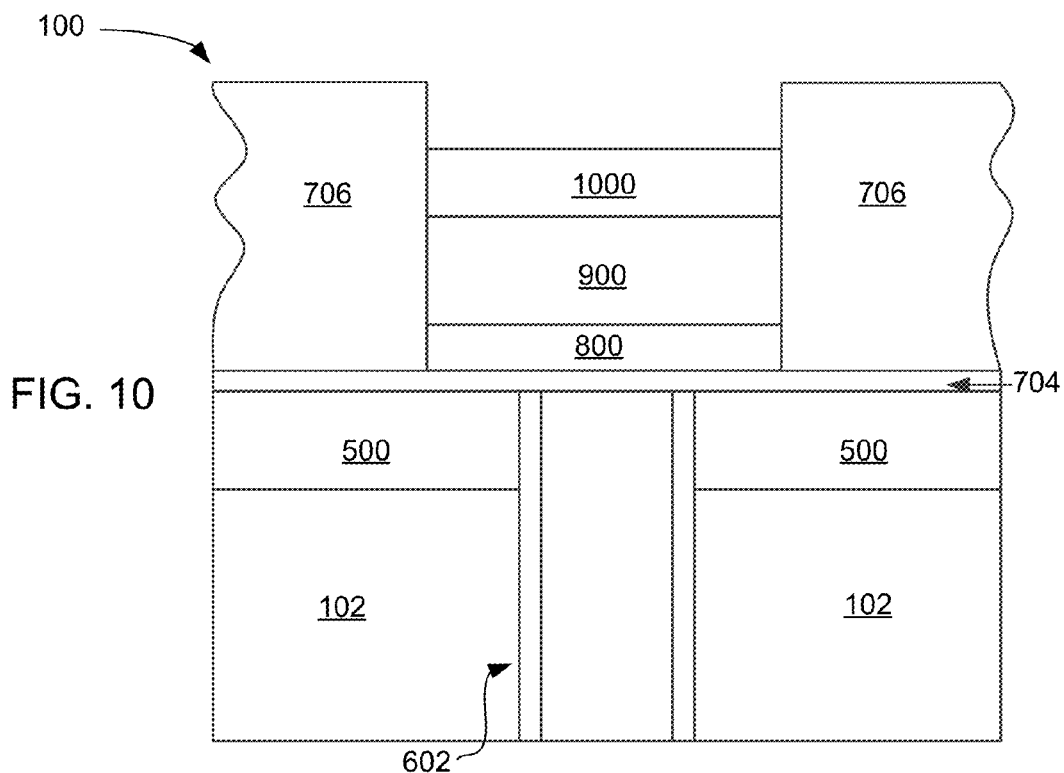
FIG. 10 is a cross-sectional view of FIG. 9 after deposition of an adhesive layer.

Referring now to FIG. 10, therein is shown a cross-sectional view of FIG. 9 after deposition of an adhesive layer 1000. The adhesive layer 1000 is patterned in the photoresist layer 706 on and over the top of the support layer 900. The adhesive layer 1000 is formed of conductive material, such as nickel, and is a different material from the support layer 900.

Figure 11:
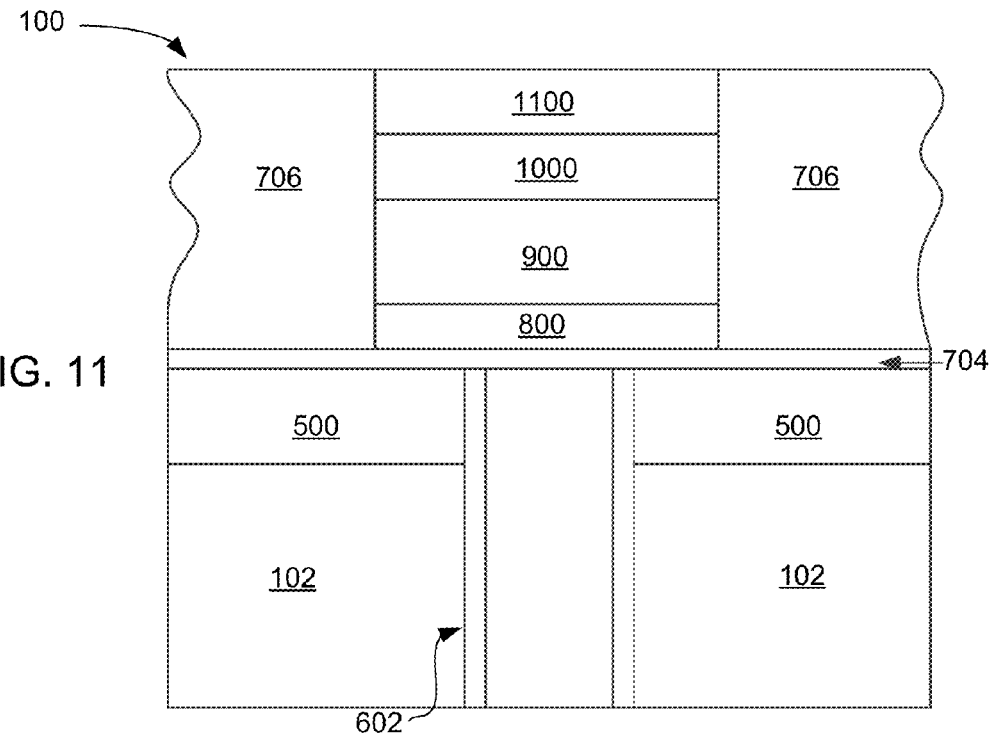
FIG. 11 is a cross-sectional view of FIG. 10 after deposition of a contact layer.

Referring now to FIG. 11, therein is shown a cross-sectional view of FIG. 10 after deposition of a contact layer 1100. The contact layer 1100 is patterned in the photoresist layer 706 on and over the top of the adhesive layer 1000 and is of a conductive material, such as gold.

Figure 12:
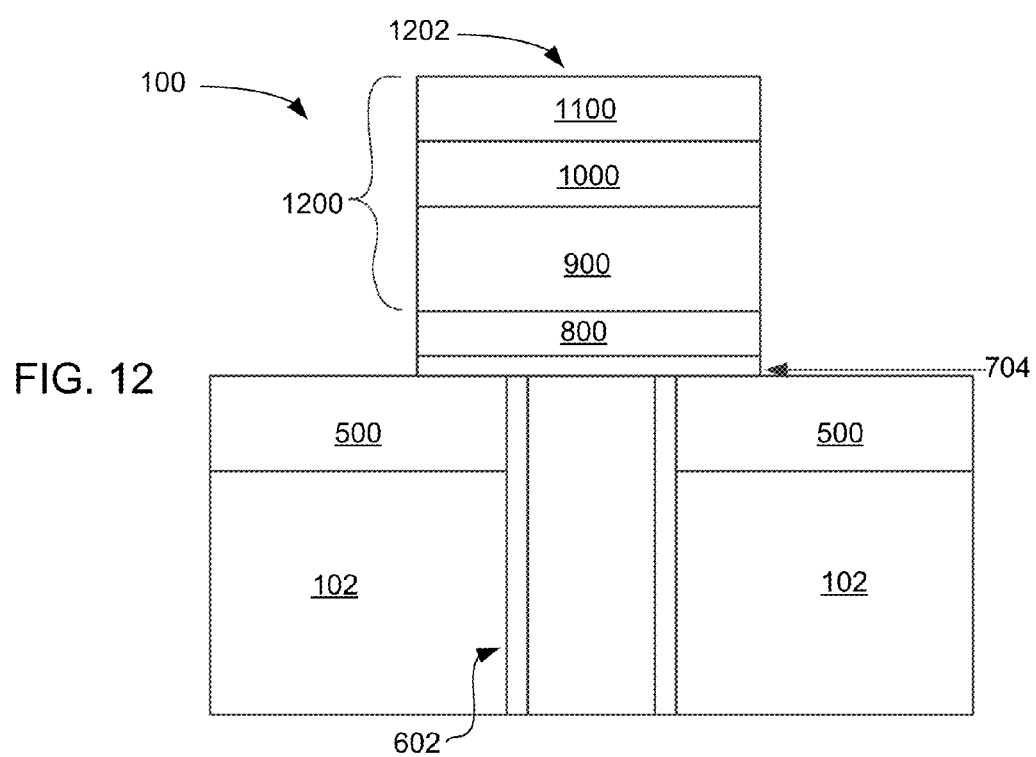
FIG. 12 is a cross-sectional view of FIG. 11 after the patterned photoresist layer is removed and the seed layer under the removed patterned photoresist layer of FIG. 11 is removed.

Referring now to FIG. 12, therein is shown a cross-sectional view of FIG. 11 after the patterned photoresist layer 706 is removed and the seed layer 704 under the removed patterned photoresist layer 706 of FIG. 11 is removed. As a matter of convenience, the combination of the support layer 900, the adhesive layer 1000, and the contact layer 1100 are referred to as a TSV cap 1200.

It has been discovered that, when the buffer layer 800 is deposited, it is possible to obtain the top planar surface 802 of FIG. 8 on the buffer layer 800 after deposition that is substantially flat. The top planar surface 802 will be without dishing or with a center depression under 1.0 µm in depth. Based on the top planar surface 802 of the buffer layer 800, a top planar surface 1202 of the TSV cap 1200 of about 6.0 µm in height will be substantially planar without dishing or with a center depression under 1.0 µm in depth at the top planar surface 1202 of the contact layer 1100.

While engineering and patent drawings often show the top planar surfaces of TSV caps without dishing, it is known that these drawings are shown this way as a matter of artistic license when in actuality, they are subject to dishing.

In three-dimensional integration, integrated circuits or chips can be integrated by stacking vertically, to reduce the length of interconnections between integrated circuits or chips and the complexity of design, meanwhile to improve the flexibility of physical design routing. In order to connect the integrated circuit to other chips or circuits above or under it, a vertical connection is needed. Thus, the TSV 602 is formed from the top surface of the passivation layer 500 to the bottom surface of the silicon substrate 102. Both ends of the TSV 602 are exposed from the silicon substrate 102 for interconnection. The size and the shape of the TSV 602 may be various depending on manufactures or technologies.

The thickness and materials of multiple layers of the TSV cap 1200 and the buffer layer 800 can vary. For example, in one embodiment, the TSV cap 1200 comprises 3 µm thick copper as the support layer 900, a 2.5 µm thick nickel as the adhesive layer 1000, and a 0.2 µm thick gold as the contact layer 1100, with a 0.5 µm thick nickel as the buffer layer 800. This 0.5 nickel/3 copper/2.5 nickel/0.2 gold/structure is used to prevent the dishing in the TSV cap 1200.

The buffer layer 800 can be deposited by plating, which does not introduce additional cost when the overall thickness of the TSV cap 1200 is decreased by the amount that the buffer layer 800 increases.

The electrical conductivity degradation due to the introduction of the buffer layer 800 is very small and negligible. For example, the resistance of one TSV cap is around 0.21Ω, while that of a 0.5 µm nickel buffer layer is 0.00011Ω. The resistance of the buffer layer 800 is significantly small comparing with the TSV with a TSV cap and does not degrade the electrical conductivity of the TSV cap. Furthermore, when introducing the nickel buffer layer, the thickness of the nickel layer in the TSV cap can be decreased to improve the electrical conductivity.

Typically, the contact layer 1100 of the TSV cap 1200 is formed of a good conductive material, for example, gold. The seed layer 704 and the buffer layer 800 are formed of different metallic materials. The top surface of the TSV cap 1200 supported by the buffer layer 800 is flat without dishing. A flat top surface of the TSV cap 1200 provides good bonding and interconnections to integrated circuits and semiconductor chips/wafers.

Figure 13:
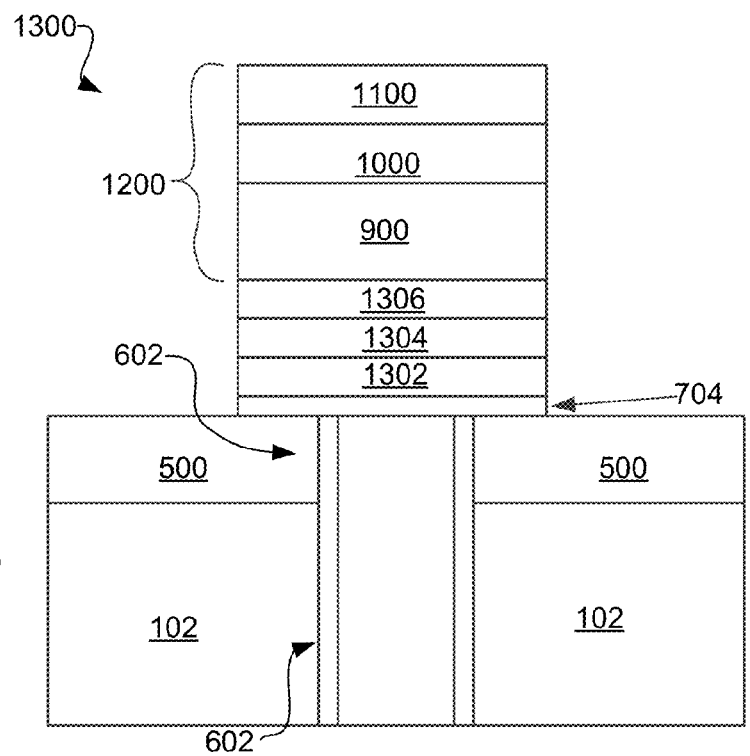
FIG. 13 is a cross-sectional view of an integrated circuit TSV system in an alternate embodiment of the present invention.

Referring now to FIG. 13, therein is shown a cross-sectional view of an integrated circuit TSV system 1300 in an alternate embodiment of the present invention. The integrated circuit TSV system 1300 is similar to the integrated circuit TSV system of FIG. 12 but with multiple buffer layers. Multiple buffer layers 1302, 1304, and 1306 are shown although more or less are possible.

The buffer layers can be single layer or multiple layers formed of metals or alloys, which can be fabricated by any deposition or coating technology, such as plating, PVD, or others. The multiple buffer layers 1302, 1304, and 1306 can be formed with different conductive materials. The buffer layer 1302 directly on and over the seed layer 704 can be formed of conductive materials other than that of the seed layer 704. The multiple buffer layers 1302, 1304, and 1306 under the support layer 900 can be formed of conductive materials other than that of the support layer 900.

Figure 14:
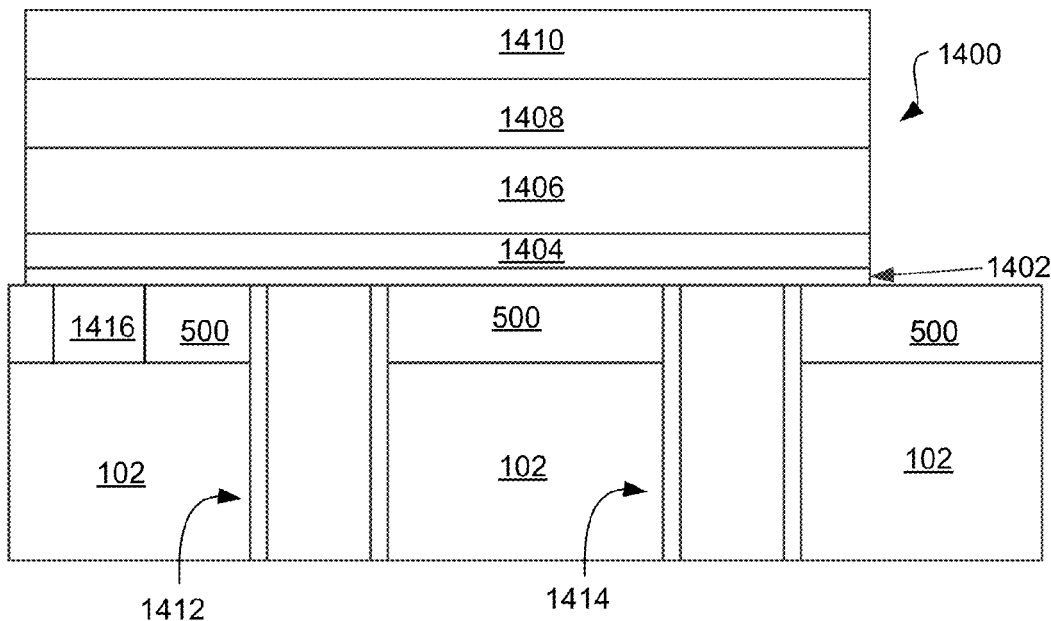
FIG. 14 is a cross-sectional view of an integrated circuit TSV redistribution layer (RDL) system.

Referring now to FIG. 14, therein is shown a cross-sectional view of an integrated circuit TSV redistribution layer (RDL) system 1400. In the integrated circuit TSV RDL system 1400, a seed layer 1402, a buffer layer 1404, a plated layer 1406, an adhesive layer 1408, and a contact layer 1410 are patterned to connect different TSVs, such as a TSV 1412 and a TSV 1414, or integrated circuit pads, such as an integrated circuit pad 1416. The integrated circuit TSV RDL system 1400 provides connections that redistribute the contacts of an integrated circuit.

Referring now to FIG. 15, therein is shown a flow chart 1500 of a method for manufacturing an integrated circuit TSV system in an embodiment of the present invention. The flow chart 1500 includes: providing a substrate having a substrate via in the substrate in a block 1502; patterning a photoresist layer over the substrate in a block 1504; patterning a buffer layer over the substrate via in the photoresist layer, the buffer layer having a planar surface in a block 1506; patterning a substrate via cap over the buffer layer in the photoresist layer, the substrate via cap having a planar surface based on the planar surface of the buffer layer in a block 1508; and removing the photoresist layer in a block 1510.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit through silicon via cap systems.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing an integrated circuit substrate via system comprising:
   providing a substrate having a substrate via in the substrate, the substrate via has a top surface and a bottom surface exposed from the substrate;
   patterning a photoresist layer over the substrate;
   patterning a buffer layer over the substrate via in the photoresist layer, the buffer layer has a planar surface;
   patterning a substrate via cap over the buffer layer in the photoresist layer, the substrate via cap has a planar surface based on the planar surface of the buffer layer;
   removing the photoresist layer; and
   patterning the substrate via cap and patterning the buffer layer include reducing a thickness of an adhesive layer of the substrate via cap to increase conductivity of the substrate via cap to compensate for increased resistivity of the buffer layer.

2. The method as claimed in claim 1 wherein patterning the buffer layer includes depositing a conductor different from the conductor of the substrate via.

3. The method as claimed in claim 1 wherein patterning the buffer layer includes providing a layer for stopping transfer of a crystalline structure of the substrate via into the buffer layer.

4. The method as claimed in claim 1 wherein patterning the substrate via cap and patterning the buffer layer includes forming a substrate via cap redistribution layer system connecting the substrate via, an integrated circuit pad, a plurality of substrate vias, a plurality of integrated circuit pads, or a combination thereof.

5. A method of manufacture of an integrated circuit through silicon via system comprising:
   providing a silicon substrate having a through silicon via in the silicon substrate, the substrate via has a top surface and a bottom surface exposed from the substrate;
   depositing a seed layer on the through silicon via; patterning a photoresist layer over the silicon substrate; patterning a buffer layer over the through silicon via in the photoresist layer, the buffer layer has a planar surface without dishing;
   patterning a through silicon via cap over the buffer layer in the photoresist layer, the through silicon via cap has a planar surface based on the planar surface of the buffer layer;
   removing the photoresist layer;
   removing the seed layer previously under the photoresist layer; and
   depositing the through silicon via cap and depositing the buffer layer include reducing a thickness of an adhesive layer of the substrate via cap to increase conductivity of the through silicon via cap to compensate for increased resistivity of the buffer layer.

6. The method as claimed in claim 5 wherein:
   forming the through silicon via with copper;
   depositing the seed layer includes forming a copper seed layer; and
   patterning the buffer layer includes depositing a conductor different from the seed layer.

7. The method as claimed in claim 5 wherein;
   depositing the seed layer includes forming a copper seed layer; and
   depositing the buffer layer includes depositing a nickel layer for stopping transfer of a crystalline structure of the seed layer into the buffer layer.

8. The method as claimed in claim 5 wherein:
   depositing the through silicon via cap, depositing the buffer layer, and removing the seed layer include patterning the through silicon via cap, the buffer layer, and the seed layer to form a through silicon via cap redistribution layer system connecting the through silicon via, an integrated circuit pad, a plurality of silicon vias, a plurality of integrated circuit pads, or a combination thereof.

9. An integrated circuit substrate via system comprising:
   a substrate having a substrate via in the substrate, the substrate via has a top surface and a bottom surface exposed from the substrate;
   a buffer layer patterned over the substrate via, the buffer layer has a planar surface; and
   a substrate via cap patterned over the buffer layer, the substrate via cap has a planar surface based on the planar surface of the buffer layer; and
   the substrate via cap and the buffer layer include a reduced thickness of an adhesive layer of the substrate via cap, to increase conductivity of the substrate via cap to compensate for increased resistivity of the buffer layer.

10. The system as claimed in claim 9 wherein the buffer layer is a conductor different from the conductor of the substrate via.

11. The system as claimed in claim 9 wherein the buffer layer is a layer for stopping transfer of a crystalline structure of the substrate via into the buffer layer.

12. The system as claimed in claim 9 wherein the substrate via cap and the buffer layer form a substrate via cap redistribution layer system connecting the substrate via, an integrated circuit pad, a plurality of substrate vias, a plurality of integrated circuit pads, or a combination thereof.

13. The system as claimed in claim 9 wherein:
   the substrate is a silicon substrate;
   the substrate via is a through silicon via;
   the buffer layer without dishing;
   the substrate via cap is a through silicon via cap having a planar surface based on the planar surface of the buffer layer; and
   further comprising:
   a seed layer is patterned on and over the through silicon via.

14. The system as claimed in claim 13 wherein:
   the through silicon via is formed with copper;
   the seed layer is a copper seed layer; and
   the buffer layer is a conductor different from the conductor of the seed layer.

15. The system as claimed in claim 13 wherein;
   the seed layer is a copper seed layer; and the buffer layer is a nickel layer for stopping transfer of a crystalline structure of the seed layer into the buffer layer.

16. The system as claimed in claim 13 wherein:
the through silicon via cap and the buffer layer include a reduced thickness of an adhesive layer of the substrate via cap to increase conductivity of the through silicon via cap to compensate for increased resistivity of the buffer layer.

17. The system as claimed in claim 13 wherein:
the through silicon via cap, the buffer layer, and the seed layer include the through silicon via cap, the buffer layer, and the seed layer patterned to form a through silicon via cap redistribution layer system connecting the through silicon via, an integrated circuit pad, a plurality of silicon vias, a plurality of integrated circuit pads, or a combination thereof.

* * * * *